US010698025B2

(12) United States Patent
Teich et al.

(10) Patent No.: US 10,698,025 B2
(45) Date of Patent: Jun. 30, 2020

(54) PROBE SYSTEMS AND METHODS THAT UTILIZE A FLOW-REGULATING STRUCTURE FOR IMPROVED COLLECTION OF AN OPTICAL IMAGE OF A DEVICE UNDER TEST

(71) Applicant: FormFactor Beaverton, Inc., Beaverton, OR (US)

(72) Inventors: Michael Teich, Moritzburg (DE); Axel Becker, Dresden (DE)

(73) Assignee: FormFactor Beaverton, Inc., Beaverton, OR (US)

( * ) Notice: Subject to any disclaimer, the term of this patent is extended or adjusted under 35 U.S.C. 154(b) by 0 days.

(21) Appl. No.: 16/445,719

(22) Filed: Jun. 19, 2019

(65) Prior Publication Data

US 2020/0025823 A1  Jan. 23, 2020

Related U.S. Application Data

(60) Provisional application No. 62/701,135, filed on Jul. 20, 2018.

(51) Int. Cl.
*G01R 31/28* (2006.01)
*H01L 21/683* (2006.01)
*H01L 21/67* (2006.01)

(52) U.S. Cl.
CPC .... *G01R 31/2874* (2013.01); *H01L 21/67248* (2013.01); *H01L 21/683* (2013.01)

(58) Field of Classification Search
CPC ........... H01L 21/67288; H01L 21/6776; H01L 21/681; H01L 21/683; H01L 21/67; H01L 21/67248; H01L 21/67259; H01L 21/68; H01L 21/68707; H01L 22/12; H01L 21/6831; H01L 27/14625; G01N 21/0332; G01N 30/88; G01L 3/08; G01R 1/06794; G01R 1/07342; G01R 31/2831; G01R 31/2862; G01R 31/2874; G01R 31/2891; G01R 31/318516
See application file for complete search history.

(56) References Cited

U.S. PATENT DOCUMENTS 8,279,577 B2 * 10/2012 Nguyen ................ C23C 14/564
                                                        361/230
9,831,111 B2 * 11/2017 Busche ............ H01L 21/67103
(Continued)

*Primary Examiner* — Vinh P Nguyen
(74) *Attorney, Agent, or Firm* — Dascenzo Intellectual Property Law, P.C.

(57) ABSTRACT

Probe systems and methods for collecting an optical image of a device under test (DUT) are disclosed herein. The probe systems include a chuck, a chuck thermal module, an enclosure, an imaging device, and a flow-regulating structure. The chuck defines a support surface configured to support a substrate and the chuck thermal module is configured to regulate a temperature of the chuck. The enclosure defines an enclosed volume, which contains the support surface of the chuck, and an aperture. The imaging device is at least partially external the enclosed volume and the enclosure and the imaging device defines a gap therebetween. The gap at least partially defines a fluid conduit that permits fluid flow between the enclosed volume and an external region. The flow-regulating structure is configured to regulate fluid flow through the fluid conduit. The methods include methods of utilizing the systems.

20 Claims, 4 Drawing Sheets

(56) References Cited

U.S. PATENT DOCUMENTS

| | | |
|---|---|---|
| 2008/0158664 A1* | 7/2008 | Teich .................. G02B 21/006 359/363 |
| 2008/0240891 A1 | 10/2008 | Obikane |
| 2010/0124610 A1* | 5/2010 | Aikawa ............... C23C 16/4584 427/255.28 |
| 2011/0024047 A1 | 2/2011 | Nguyen et al. |
| 2014/0184003 A1 | 7/2014 | Kiesewetter et al. |

* cited by examiner

PROBE SYSTEMS AND METHODS THAT UTILIZE A FLOW-REGULATING STRUCTURE FOR IMPROVED COLLECTION OF AN OPTICAL IMAGE OF A DEVICE UNDER TEST

RELATED APPLICATION

This application claims priority to U.S. Provisional Patent Application No. 62/701,135, which was filed on Jul. 20, 2018, and the complete disclosure of which is hereby incorporated by reference.

FIELD OF THE DISCLOSURE

The present disclosure relates generally to probe systems and methods for collecting an optical image of a device under test.

BACKGROUND OF THE DISCLOSURE

Probe systems may be utilized to test the operation of a device under test (DUT). In such probe systems, an imaging device, such as a microscope, often is utilized to collect an optical image of the DUT, such as to facilitate alignment of one or more probes of the probe system with one or more probed locations of the DUT.

The DUT may be tested at elevated temperatures and/or under controlled environmental conditions. During such testing, thermal gradients may exist and/or extend between the imaging device and the DUT, and these thermal gradients may cause variation, or flicker, in the optical image that is collected by the imaging device. Such variation may make it difficult to collect an accurate optical image of the DUT and/or may make it difficult to accurately align the probes with the probed locations of the DUT. Thus, there exists a need for improved probe systems and methods for collecting an optical image of a device under test.

SUMMARY OF THE DISCLOSURE

Probe systems and methods for collecting an optical image of a device under test (DUT) are disclosed herein. The probe systems include a chuck, a chuck thermal module, an enclosure, an imaging device, and a flow-regulating structure. The chuck defines a support surface configured to support a substrate and the chuck thermal module is configured to regulate a temperature of the chuck. The enclosure defines an enclosed volume, which contains the support surface of the chuck, and an aperture. The imaging device is at least partially external the enclosed volume and the enclosure and the imaging device define a gap therebetween. The gap at least partially defines a fluid conduit that permits fluid flow between the enclosed volume and an external region. The flow-regulating structure is configured to regulate fluid flow through the fluid conduit.

The methods include methods of utilizing the systems to collect an optical image of a DUT. The methods include placing a substrate, which includes a DUT, on a support surface of a chuck. The support surface is contained within an enclosed volume of an enclosure. The methods also include selectively regulating a temperature of the chuck with a chuck thermal module. The methods further include selectively regulating a fluid flow rate through a fluid conduit based, at last in part, on the temperature of the chuck. The fluid conduit is at least partially defined by a gap that extends between the enclosure and an imaging device of the probe system. The methods also include collecting the optical image of the DUT with the imaging device via an optical pathway that extends through an aperture that is defined by the enclosure.

DETAILED DESCRIPTION AND BEST MODE OF THE DISCLOSURE

Figure 1:
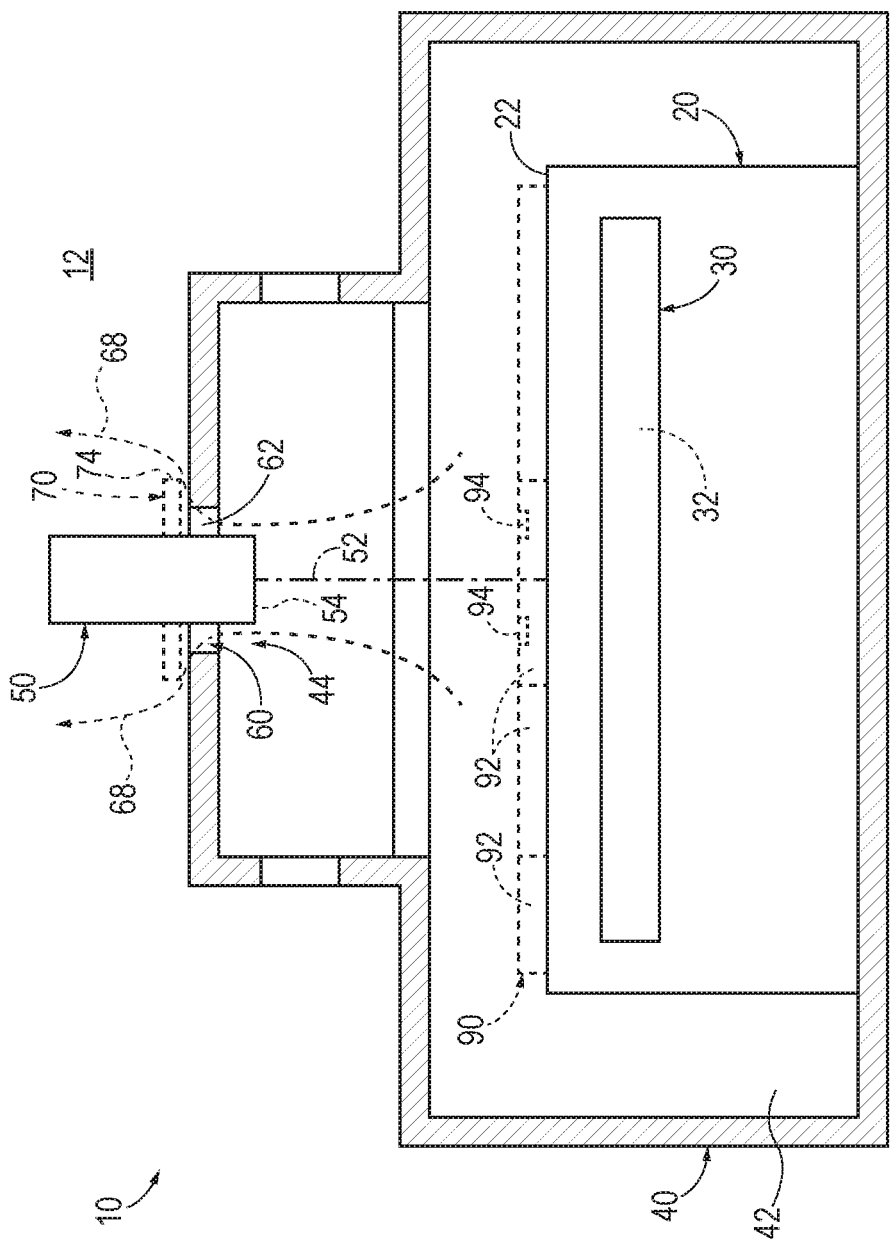
FIG. 1 is a schematic cross-sectional view of examples of probe systems according to the present disclosure.

FIGS. 1-4 provide examples of probe systems 10 and/or of methods 200, according to the present disclosure. Elements that serve a similar, or at least substantially similar, purpose are labeled with like numbers in each of FIGS. 1-4, and these elements may not be discussed in detail herein with reference to each of FIGS. 1-4. Similarly, all elements may not be labeled in each of FIGS. 1-4, but reference numerals associated therewith may be utilized herein for consistency. Elements, components, and/or features that are discussed herein with reference to one or more of FIGS. 1-4 may be included in and/or utilized with any of FIGS. 1-4 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 2:
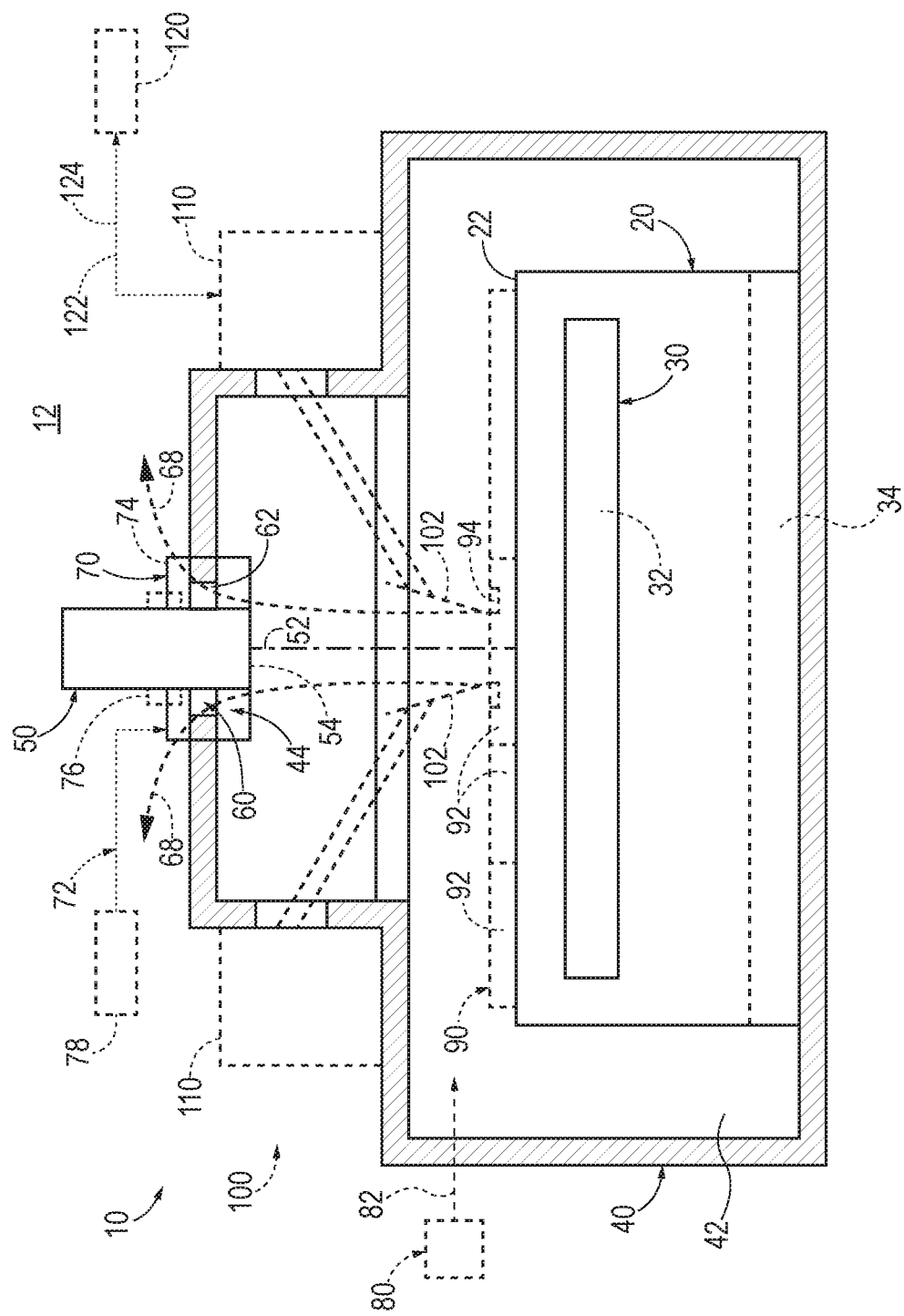
FIG. 2 is a schematic cross-sectional view of examples of probe systems according to the present disclosure.
Figure 3:
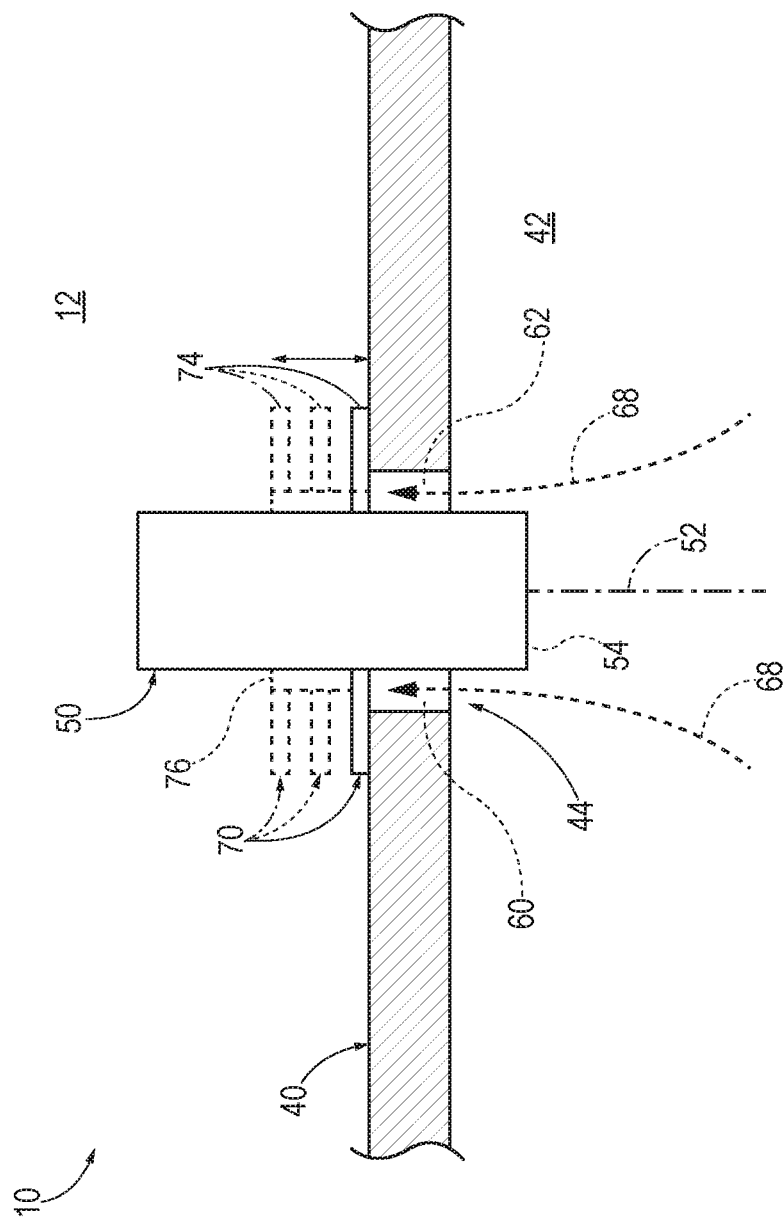
FIG. 3 is a schematic cross-sectional view of a portion of a probe system, according to the present disclosure, illustrating a plurality of different orientations for a flow-regulating structure of the probe system.

FIGS. 1-2 are schematic cross-sectional views of examples of probe systems 10 according to the present disclosure, while FIG. 3 is a schematic cross-sectional view of a portion of a probe system 10, according to the present disclosure, illustrating a plurality of different orientations for a flow-regulating structure 70 of the probe system. As illustrated in FIGS. 1-3, probe systems 10 include an enclosure 40 that defines an enclosed volume 42 and an aperture 44. As also illustrated in FIGS. 1-3, probe systems 10 further include an imaging device 50, which is at least partially, and optionally completely, external to enclosed volume 42. Imaging device 50 and enclosure 40 form and/or define a gap 60 therebetween. Gap 60 at least partially defines a fluid conduit 62, and the fluid conduit may be configured to permit a fluid flow 68, via aperture 44, between enclosed volume 42 and a region 12 that is external to the enclosed volume. Region 12 may include any suitable atmosphere and/or environment, such as an ambient environment, that surrounds probe system 10 and/or enclosure 40 thereof.

Turning now to FIGS. 1-2, probe systems 10 also include a chuck 20 that defines a support surface 22. Support surface 22 extends within enclosed volume 42. Stated another way, the enclosed volume contains and/or houses the support surface and/or the enclosure surrounds the support surface. Support surface 22 may be configured to support a substrate 90. Probe systems 10 further include a chuck thermal module 30, which is configured to control and/or regulate a temperature of chuck 20, of support surface 22, and/or of substrate 90 when the substrate is supported by the chuck and/or on the support surface.

With continued reference to FIGS. 1-2, aperture 44 may be formed and/or defined within a portion of enclosure 40 that faces toward support surface 22 of chuck 20. In addition, imaging device 50 may be configured to generate an optical image of at least a portion of substrate 90 via an optical pathway 52. Optical pathway 52 may be referred to herein as extending between support surface 22 and imaging device 50, as extending from support surface 22 toward imaging device 50, as extending from support surface 22 toward aperture 44, as extending between substrate 90 and imaging device 50, as extending to aperture 44, and/or as extending through aperture 44.

During operation of probe systems 10, chuck thermal module 30 may be utilized to selectively control and/or regulate the temperature of chuck 20, thereby controlling and/or regulating the temperature of a substrate 90 that is supported by chuck 20. This regulation of the temperature of chuck 20 may generate thermal gradients within enclosed volume 42, such as which may be caused by a temperature differential between chuck 20 and one or more other components of probe system 10. These thermal gradients may cause variations in a refractive index of a fluid, such as a gas and/or air, that may fill enclosed volume 42, and these variations in refractive index may cause variations, instability, and/or flicker in images that are collected by imaging device 50.

However, in probe systems 10 according to the present disclosure, the thermal gradients also may produce and/or generate fluid flow 68, which also may be referred to herein as a naturally convective fluid flow 68, as a naturally occurring fluid flow 68, as a laminar fluid flow 68, and/or as a laminar air stream 68. Fluid flow 68 may flow from enclosed volume 42 to region 12 that is external to enclosed volume 42 via aperture 44 and/or via fluid conduit 62. Fluid flow 68 may cause fluid, which is present along optical pathway 52, to be more uniform, or to have a uniform, at least substantially uniform, stable, or at least substantially stable, refractive index, thereby decreasing a potential for, or even eliminating, image flicker in probe systems 10 according to the present disclosure.

As discussed in more detail herein with reference to methods 200, probe systems 10 also may utilize flow-regulating structure 70, when present, to control and/or regulate the flow rate of fluid flow 68 from enclosed volume 42. In such a configuration, flow-regulating structure 70 may be closed, may restrict fluid flow through fluid conduit 62, and/or may exhibit a maximum resistance to flow of fluid flow 68 when the temperature of chuck 20 is low, or is less than a threshold temperature. In addition, flow-regulating structure 70 may be open, may permit fluid flow through fluid conduit 62, and/or may selectively regulate fluid flow through the fluid conduit when the temperature of chuck 20 is high, or is greater than the threshold temperature. Examples of the threshold temperature are disclosed herein.

Flow-regulating structure 70 may include and/or be any suitable structure that may be adapted, configured, designed, sized, and/or constructed to regulate, or to selectively regulate, fluid flow 68 through fluid conduit 62. As an example, flow-regulating structure 70 may be configured to selectively obstruct the fluid flow through the fluid conduit. As another example, the flow-regulating structure may be configured to regulate, to selectively regulate, and/or to selectively vary a resistance to fluid flow through the fluid conduit. As a more specific example, the flow-regulating structure may be configured to regulate, or to automatically regulate, the resistance to fluid flow based, at least in part, on the temperature of chuck 20. As additional more specific examples, the flow-regulating structure may be configured to selectively decrease the resistance to fluid flow through the fluid conduit responsive to an increase in the temperature of the chuck and/or to selectively increase the resistance to fluid flow through the fluid conduit responsive to a decrease in the temperature of the chuck.

The resistance to fluid flow may be selectively regulated and/or controlled within a resistance range and/or within an adjustment range. This control may be referred to herein as being between a minimum resistance, or a minimum value of the resistance range, and a maximum resistance, or a maximum value of the resistance range. An example of a configuration of flow-regulating structure 70 that provides the maximum resistance to fluid flow is illustrated in solid lines in FIG. 3. Such a configuration also may be referred to herein as restricting, blocking, and/or occluding the fluid flow and/or as forming a fluid seal with enclosure 40. An example of a configuration of flow-regulating structure 70 that provides the minimum resistance to fluid flow is illustrated in dash-dot lines in FIG. 3, while an example of an intermediate configuration of flow-regulating structure 70 that provides an intermediate resistance to fluid flow is illustrated in dashed lines in FIG. 3.

The flow-regulating structure may be configured to maintain the resistance to fluid flow at, or near, the maximum resistance when the temperature of the chuck is less than the threshold temperature. In addition, the flow-regulating structure may be configured to selectively regulate the resistance to fluid flow between the minimum resistance and the maximum resistance when the temperature of the chuck is greater than the threshold temperature. Examples of the threshold temperature include threshold temperatures of at least −100° C., at least −80° C., at least −60° C., at least −40° C., at least −30° C., at least −20° C., at least −10° C., at least 0° C., at least 10° C., at least 20° C., at most 400° C., at most 300° C., at most 200° C., at most 100° C., at most 80° C., at most 60° C., at most 40° C., at most 20° C., at most 0° C., and/or at most −20° C.

An example of flow-regulating structure 70 includes a passive flow-regulating structure 70, which is configured to passively regulate the fluid flow through the fluid conduit based, at least in part, on a temperature of the flow-regulating structure. As an example, flow-regulating structure 70 may include an adjustment mechanism 76, as illustrated in FIGS. 2-3, that may be configured to selectively adjust an orientation of the flow-regulating structure relative to enclosure 40. As a more specific example, flow-regulating structure 70 may include a light shield 74, which is configured to restrict light from entering enclosed volume 42 via gap 60 and/or aperture 44. Under these conditions, flow-regulating structure 70 and/or adjustment mechanism 76 thereof may be configured to selectively change an orientation of light shield 74 relative to the enclosure. This may include selectively regulating a distance between the light shield and the enclosure to regulate the fluid flow through the fluid conduit, as illustrated in FIG. 3.

Adjustment mechanism 76 also may be referred to herein as a passive adjustment mechanism 76 and/or as a passive actuator 76. Examples of passive actuator 76 include one or more of a thermally actuated passive actuator, a bimetallic actuator, a shape memory alloy actuator, a liquid-powered actuator, a gas-powered actuator, and/or a solid-powered actuator.

Another example of flow-regulating structure 70 includes an active flow-regulating structure 70. Active flow-regulating structure 70 may be configured to regulate, or to actively regulate, fluid flow 68 through fluid conduit 62 responsive to receipt of a control signal 72, which may be provided by a controller 78, as illustrated in FIG. 2. Active flow-regulating structures 70 may include adjustment mechanisms 76 in the form of active adjustment mechanisms 76 and/or an active actuator 76, which may be actuated based upon, or responsive to, the control signal. Examples of such active actuators include one or more of a piezoelectric element, a motor, a linear actuator, a pneumatic actuator, and/or an electrical actuator. Examples of control signal 72 include one or more of an electric signal, a pneumatic signal, a hydraulic signal, and/or an electromagnetic signal.

Gap 60 may have and/or define any suitable shape. As an example, at least a portion of imaging device 50 may extend within aperture 44, and gap 60 may be an annular gap that extends between enclosure 40 and a portion of the imaging device that extends within the aperture. The portion of the imaging device that extends within the aperture, when present, may include a lens 54 of the imaging device.

As illustrated in dashed lines in FIG. 2, probe systems 10 may include a purge gas supply system 80. Purge gas supply system 80, when present, may be configured to generate a purge gas stream 82 and/or to supply, or to selectively supply, the purge gas stream to enclosed volume 42. As an example, the purge gas supply system may be configured to supply the purge gas stream to the enclosed volume when the temperature of chuck 20 is less than the threshold temperature, examples of which are disclosed herein. As another example, the purge gas supply system may be configured to cease supply of the purge gas stream to the enclosed volume when the temperature of the chuck is greater than the threshold temperature. The purge gas stream may include, or be, a dry, a low-humidity, a water-free, and/or an at least substantially water-free purge gas stream. As such, supplying the purge gas stream to the enclosed volume when the temperature of the chuck is less than the threshold temperature may resist, limit, and/or avoid water condensation and/or ice formation within the enclosed volume, on the chuck, and/or on the substrate. This may permit probe systems 10 to reliably operate at low, or sub-freezing, temperatures.

When probe systems 10 include purge gas supply system 80, flow-regulating structure 70 may be configured to maintain the resistance to fluid flow through fluid conduit 62 at, or near, the maximum resistance when the purge gas stream is supplied to the enclosed volume. In addition, flow-regulating structure 70 may be configured to selectively regulate, or vary, the resistance to fluid flow through the fluid conduit when the purge gas stream is not supplied to the enclosed volume. Such a configuration may avoid high, or forced, flow rates for fluid flow 68, which may be detrimental to the quality of optical images collected by imaging device 50.

Chuck thermal module 30 may include any suitable structure that may be adapted, configured, designed, and/or constructed to control and/or regulate the temperature of chuck 20. This may include control and/or regulation of the temperature of chuck 20 between a minimum chuck temperature and a maximum chuck temperature. Examples of the minimum chuck temperature include temperatures of at most 0° C., at most −20° C., at most −40° C., at most −60° C., at most −80° C., at most −100° C., or at most −150° C. Examples of the maximum chuck temperature include temperatures of at least 200° C., at least 250° C., at least 300° C., at least 350° C., at least 400° C., at least 450° C., or at least 500° C. Examples of chuck thermal module 30 include any suitable heating device, heater, heat transfer device, cooling device, and/or chiller.

As illustrated in dashed lines in FIGS. 1-2, chuck thermal module 30, chuck 20, and/or probe system 10 may include a temperature sensor 32. Temperature sensor 32, when present, may be configured to measure the temperature of at least a portion of chuck 20, and it is within the scope of the present disclosure that flow-regulating structure 70 may regulate the flow rate of fluid flow 68 based, at least in part, on the temperature that is measured by temperature sensor 32.

As illustrated in dashed lines in FIG. 2, probe system 10 may include a chuck translation structure 34. Chuck translation structure 34 may be configured to operatively translate chuck 20 and/or support surface 22 thereof. This may include operative translation of the chuck relative to one or more probes 102 of a probe assembly 100, which are discussed in more detail herein.

Imaging device 50 may include any suitable structure that may be adapted, configured, designed, and/or constructed to generate one or more optical images of substrate 90 via optical pathway 52. As examples, imaging device 50 may include one or more of a microscope, a microscope that includes an eyepiece, a microscope that does not include an eyepiece, a camera, a charge-coupled device, an imaging sensor, a solid state imaging device, a C-MOS imaging device, and/or lens 54. As illustrated, imaging device 50 may extend partially, or at least partially, within enclosed volume 42; however, this is not required in all embodiments of probe systems 10 according to the present disclosure.

Fluid conduit 62 may include, or be defined by, any suitable structure and/or space, such as gap 60, that permits fluid flow 68 between enclosed volume 42 and region 12 that is external to enclosed volume 42. As examples, aperture 44 and/or imaging device 50 may at least partially define the fluid conduit. As another example, the fluid conduit may extend through the aperture.

Substrate 90 may include and/or be any suitable structure that may be supported by support surface 22, that may be imaged by imaging device 50, and/or that may be tested by probe system 10. As an example, substrate 90 may include one or more of a semiconductor substrate, a silicon substrate, and/or a III-V semiconductor substrate. As another example, substrate 90 may include at least one, or even a plurality, of devices under test (DUT) 92. Examples of DUTs 92 include any suitable semiconductor device, optoelectronic device, and/or solid state device.

Probe system 10 may be configured to test the operation of the DUT. DUTs 92 may include probed locations 94, such as contact pads and/or solder bumps, that may be configured to be electrically contacted by probes 102 of probe systems 10, as discussed in more detail herein. Additionally or alternatively, probed locations 94 may be configured for non-contact, for optical, and/or for electromagnetic communication with probes 102.

With continued reference to FIG. 2, probe system 10 may include one or more additional, or conventional, structures and/or components. As an example, probe system 10 may include a signal generation and analysis assembly 120. Signal generation and analysis assembly 120, when present, may be configured to generate a test signal 122, to provide the test signal to the DUT, and/or to receive a resultant signal 124 from the DUT. Signal generation and analysis assembly 120, when present, additionally or alternatively may be configured to analyze the resultant signal, to compare the resultant signal to the test signal, and/or to quantify the operation of the DUT based, at least in part, on the test signal and/or on the resultant signal.

As another example, probe system 10 may include probe assembly 100, and probe assembly 100 may be configured to receive the test signal from the signal generation and analysis assembly, to provide the test signal to the DUT, to receive the resultant signal from the DUT, and/or to provide the resultant signal to the signal generation and analysis assembly. As yet another example, probe assembly 100 may include one or more probes 102. Probes 102 may be configured to electrically contact corresponding probed locations 94 on DUT 92.

As another example, probe assembly 100 may include one or more manipulators 110. Manipulators 110, when present, may be configured to operatively translate one or more probes 102 relative to a remainder of the probe assembly, relative to support surface 22, relative to DUT 92, and/or relative to probed locations 94.

It is within the scope of the present disclosure that probe assembly 100 may communicate with, or test, DUT 92 in any suitable manner, including via electrical communication between the probe assembly and the DUT via probes 102. As additional and/or alternative examples, probe assembly 100 may be configured for electromagnetic, wireless, and/or optical communication with, and/or testing of, the DUT.

Figure 4:
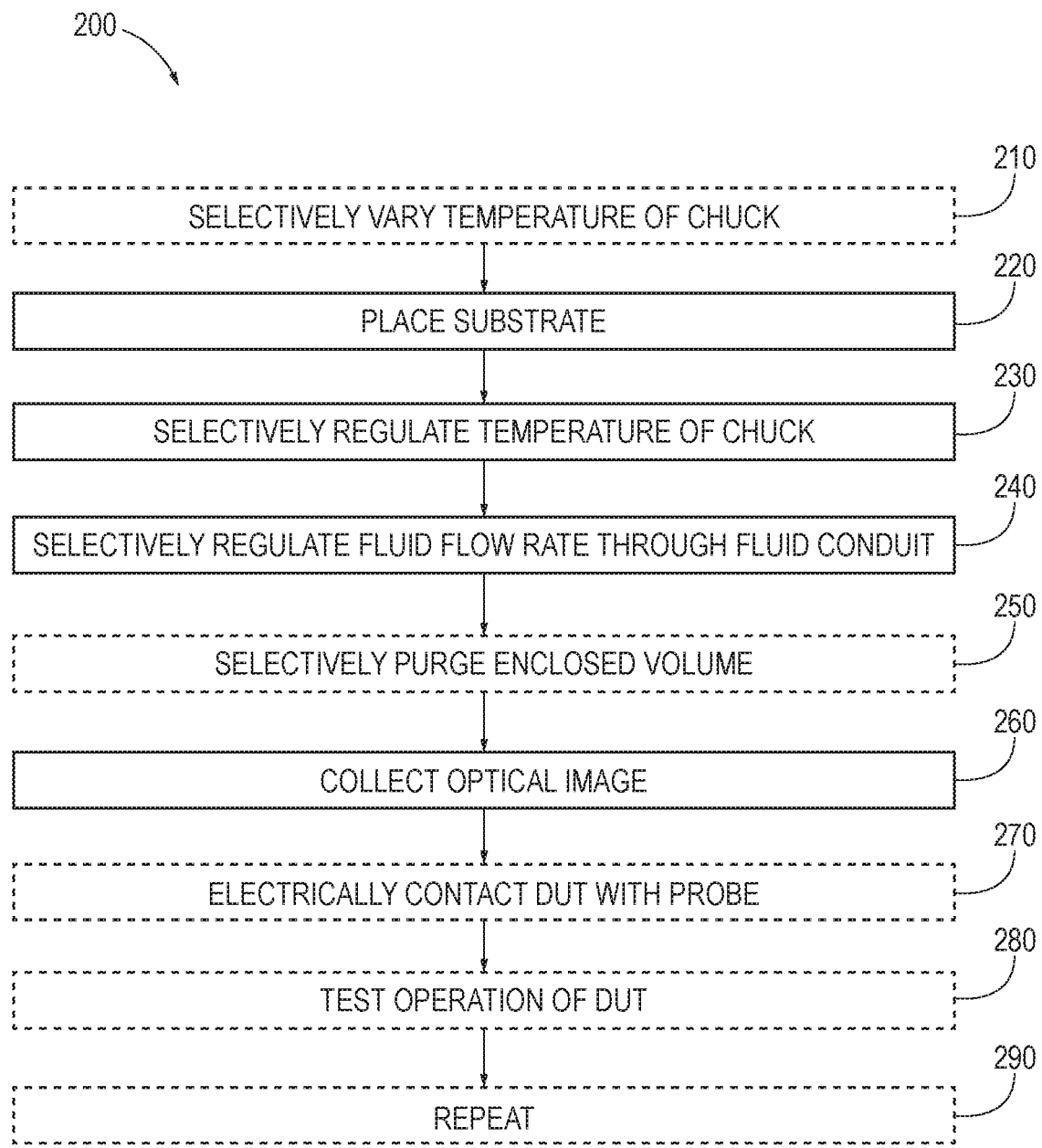
FIG. 4 is a flowchart depicting methods, according to the present disclosure, of utilizing a probe system to collect an optical image of a device under test.

FIG. 4 is a flowchart depicting methods 200, according to the present disclosure, of utilizing a probe system, such as probe system 10 of FIGS. 1-3, to collect an optical image of a device under test (DUT). Methods 200 may include selectively varying a temperature of a chuck at 210 and include placing a substrate at 220, selectively regulating the temperature of the chuck at 230, and selectively regulating a fluid flow rate through a fluid conduit at 240. Methods 200 may include selectively purging an enclosed volume at 250 and include collecting an optical image at 260. Methods 200 further may include electrically contacting a device under test (DUT) with a probe at 270, testing the operation of the DUT at 280, and/or repeating at least a portion of the methods at 290.

Selectively varying the temperature of the chuck at 210 may include selectively varying the temperature of the chuck between a minimum chuck temperature and a maximum chuck temperature, such as to set, fix, and/or establish a fixed, target, and/or test temperature of the chuck for subsequent steps of methods 200. Examples of the minimum chuck temperature and the maximum chuck temperature are disclosed herein. It is within the scope of the present disclosure that the selectively varying at 210 may be performed with and/or utilizing any suitable structure and/or structures, such as chuck thermal module 30 of FIGS. 1-2.

Placing the substrate at 220 may include placing any suitable substrate on a support surface of a chuck in any suitable manner. The support surface is contained within an enclosed volume of an enclosure. Examples of the support surface are disclosed herein with reference to support surface 22 of FIGS. 1-2. Examples of the chuck are disclosed herein with reference to chuck 20 of FIGS. 1-2. Examples of the enclosure are disclosed herein with reference to enclosure 40 of FIGS. 1-3. Examples of the enclosed volume are disclosed herein with reference to enclosed volume 42 of FIGS. 1-3. The substrate includes the DUT, and examples of the substrate are disclosed herein with reference to substrate 90 of FIGS. 1-2.

Selectively regulating the temperature of the chuck at 230 may include selectively regulating the temperature of the chuck with a chuck thermal module, such as chuck thermal module 30 of FIGS. 1-2. The selectively regulating at 230 may include maintaining the temperature of the chuck at the fixed, target, and/or test temperature, such as may be established during the selectively varying at 210. The selectively regulating at 230 additionally or alternatively may include maintaining the temperature of the chuck at the fixed, target, and/or test temperature during the selectively regulating at 240, during the selectively purging at 250, during the collecting at 260, during the electrically contacting at 270, and/or during the testing at 280.

Selectively regulating the fluid flow rate through the fluid conduit at 240 may include selectively regulating based, at least in part, on the temperature of the chuck, on an actual temperature of the chuck, and/or on the fixed, target, and/or test temperature for the chuck. The fluid conduit may be at least partially defined by a gap that extends between the enclosure and an imaging device, and the imaging device may be utilized during the collecting at 260 to collect the optical image of the DUT.

The selectively regulating at 240 may include selectively regulating in any suitable manner. As an example, the selectively regulating at 240 may include selectively increasing the fluid flow rate responsive to an increase in the temperature of the chuck. As another example, the selectively regulating at 240 may include selectively decreasing the fluid flow rate responsive to a decrease in the temperature of the chuck.

As yet another example, the selectively regulating at 240 may include regulating a resistance to fluid flow through the fluid conduit. This may include selectively decreasing the resistance to fluid flow through the fluid conduit responsive to an increase in the temperature of the chuck and/or selectively increasing the resistance to fluid flow through the fluid conduit responsive to a decrease in the temperature of the chuck. The resistance to fluid flow through the fluid conduit may be selectively regulated between a minimum resistance and a maximum resistance.

The selectively regulating at 240 may be performed during any suitable portion of methods 200. As an example, the selectively regulating at 240 may be performed continuously, or at least substantially continuously, during a remainder of methods 200, may be performed during the selectively varying at 210, and/or may be performed during the selectively regulating at 230. In addition, the selectively regulating at 240 may be performed with, via, and/or utilizing any suitable structure, such as chuck thermal module 30 of FIGS. 1-2.

Selectively purging the enclosed volume at 250 may include selectively purging the enclosed volume of the enclosure with a purge gas stream. It is within the scope of the present disclosure that the selectively purging at 250 may include selectively purging when the temperature of the chuck is less than a threshold temperature and selectively ceasing the purging when the temperature of the chuck is greater than the threshold temperature. Examples of the threshold temperature are disclosed herein.

When methods 200 include the selectively purging at 250, the selectively regulating at 240 may include maintaining the resistance to fluid flow at, or near, the maximum resistance during the purging at 250 and/or while the temperature of the chuck is less than the threshold temperature. Under these conditions, the selectively regulating at 240 also may include selectively varying the resistance to fluid flow between the minimum resistance and the maximum resistance during the selectively ceasing the purging and/or when the temperature of the chuck is greater than the threshold temperature.

The selectively purging at 250 may be performed utilizing any suitable structure, such as purge gas supply system 80 of FIG. 2. In addition, the selectively purging at 250 may be performed with any suitable timing and/or sequence during methods 200. As examples, the selectively purging at 250 may be performed during the selectively varying at 210, during the placing at 220, during the selectively regulating at 230, during the selectively regulating at 240, during the collecting at 260, during the electrically contacting at 270, during the testing at 280, and/or during the repeating at 290.

Collecting the optical image at 260 may include collecting any suitable optical image of the DUT with the imaging device and/or via an optical pathway. The optical pathway extends through an aperture that is defined by the enclosure. Examples of the imaging device are disclosed herein with reference to imaging device 50 of FIGS. 1-3. Examples of the aperture are disclosed herein with reference to aperture 44 of FIGS. 1-3.

Electrically contacting the DUT with the probe at 270 may include electrically contacting with a probe of a probe assembly. This may include electrically contacting any suitable portion of the DUT, such as a probed location of the DUT. Examples of the probe are disclosed herein with reference to probes 102 of FIG. 2. Examples of the probe assembly are disclosed herein with reference to probe assembly 100 of FIG. 2. Examples of the probed location are disclosed herein with reference to probed location 94 of FIGS. 1-2.

When methods 200 include the electrically contacting at 270, it is within the scope of the present disclosure that the electrically contacting at 270 may be performed concurrently, or at least substantially concurrently, with the collecting at 260. As an example, methods 200 may include performing the collecting at 260 during the electrically contacting at 270, such as to observe, permit, and/or facilitate the electrically contacting at 270.

The electrically contacting at 270 further may include positioning the substrate and/or the DUT relative to the probe, such as to align the DUT and the probe, to facilitate contact between the DUT and the probe, and/or to facilitate contact between the probed location of the DUT and the probe. The positioning may include operatively translating the DUT relative to the probe, operatively translating the probe relative to the DUT, rotating the DUT relative to the probe, and/or rotating the probe assembly relative to the DUT, and the collecting at 260 may include observing the alignment between the DUT and the probe.

Testing the operation of the DUT at 280 may include testing the operation of the DUT in any suitable manner. As an example, and when methods 200 include the electrically contacting at 270, the testing at 280 may include providing a test signal to the DUT and/or receiving a resultant signal from the DUT with, via, and/or utilizing the probe. As additional examples, the testing at 280 may include electromagnetically, optically, and/or wirelessly testing the operation of the DUT.

Repeating at least a portion of the methods at 290 may include repeating any suitable portion of methods 200 in any suitable manner. As an example, the test temperature of the chuck may be a first test temperature of the chuck and the optical image of the DUT may be a first optical image of the DUT. Under these conditions, the repeating at 290 may include performing the selectively varying at 210 to set, fix, and/or establish a second test temperature for the chuck and repeating at least the selectively regulating at 240 and the collecting at 260 to collect a second optical image of the DUT at the second test temperature for the chuck.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of probe systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe system, comprising:
a chuck defining a support surface configured to support a substrate;
a chuck thermal module configured to regulate a temperature of the chuck;
an enclosure defining:
(i) an enclosed volume that contains the support surface of the chuck; and
(ii) an aperture defined within a portion of the enclosure that faces toward the support surface of the chuck; and
an imaging device at least partially external to the enclosed volume and configured to generate an optical image of at least a portion of the substrate via an optical pathway that extends from the support surface and toward the aperture;
wherein the enclosure and the imaging device define a gap therebetween, wherein the gap at least partially defines a fluid conduit that permits fluid flow, via the aperture, between the enclosed volume and an external region that is external the enclosed volume.

A2. The probe system of paragraph A1, wherein the probe system further includes a flow-regulating structure configured to regulate fluid flow through the fluid conduit.

A3. The probe system of paragraph A2, wherein the flow-regulating structure is configured to selectively obstruct fluid flow through the fluid conduit.

A4. The probe system of any of paragraphs A2-A3, wherein the flow-regulating structure is configured to regulate, or to selectively regulate, a resistance to fluid flow through the fluid conduit.

A5. The probe system of any of paragraphs A2-A4, wherein the flow-regulating structure is configured to automatically regulate the resistance to fluid flow based, at least in part, on the temperature of the chuck.

A6. The probe system of any of paragraphs A2-A5, wherein the flow-regulating structure is configured to at least one of:
(i) selectively decrease a/the resistance to fluid flow through the fluid conduit responsive to an increase in the temperature of the chuck; and
(ii) selectively increase the resistance to fluid flow through the fluid conduit responsive to a decrease in the temperature of the chuck.

A7. The probe system of any of paragraphs A2-A6, wherein the flow-regulating structure is configured to selectively regulate a/the resistance to fluid flow through the fluid conduit between a minimum resistance and a maximum resistance, and further wherein the flow-regulating device is configured to:
(i) maintain the resistance to fluid flow through the fluid conduit at the maximum resistance when the temperature of the chuck is less than a threshold temperature of the chuck; and
(ii) selectively regulate the resistance to fluid flow through the fluid conduit between the minimum resistance and the maximum resistance when the temperature of the chuck is greater than the threshold temperature of the chuck.

A8. The probe system of paragraph A7, wherein the threshold temperature is at least one of:
(i) at least −100° C., at least −80° C., at least −60° C., at least −40° C., at least −30° C., at least −20° C., at least −10° C., at least 0° C., at least 10° C., or at least 20° C.; and
(ii) at most 400° C., at most 300° C., at most 200° C., at most 100° C., at most 80° C., at most 60° C., at most 40° C., at most 20° C., at most 0° C., or at most −20° C.

A9. The probe system of any of paragraphs A2-A8, wherein the flow-regulating structure is a passive flow-regulating structure configured to passively regulate the fluid flow through the fluid conduit based, at least in part, on a temperature of the flow-regulating structure.

A10. The probe system of any of paragraphs A2-A9, wherein the flow-regulating structure includes a passive actuator, optionally wherein the passive actuator includes at least one of:
  (i) a thermally actuated passive actuator;
  (ii) a bimetallic actuator;
  (iii) a shape memory alloy actuator;
  (iv) a liquid-powered actuator;
  (v) a gas-powered actuator; and
  (vi) a solid-powered actuator.

A11. The probe system of any of paragraphs A2-A10, wherein the flow-regulating structure is an actively controlled flow-regulating structure configured to regulate the fluid flow through the fluid conduit responsive to receipt of a control signal.

A12. The probe system of paragraph A11, wherein the actively controlled flow-regulating structure includes at least one of:
  (i) a piezoelectric element;
  (ii) a motor;
  (iii) a linear actuator;
  (iv) a pneumatic actuator; and
  (v) an electrical actuator.

A13. The probe system of any of paragraphs A11-A12, wherein the control signal includes at least one of:
  (i) an electric signal;
  (ii) a pneumatic signal;
  (iii) a hydraulic signal; and
  (iv) an electromagnetic signal.

A14. The probe system of any of paragraphs A2-A13, wherein the flow-regulating structure includes a light shield configured to restrict light from entering the enclosed volume via the gap, and further wherein the flow-regulating structure is configured to selectively regulate a distance between the light shield and the enclosure to regulate the fluid flow through the fluid conduit.

A15. The probe system of any of paragraphs A1-A14, wherein at least a portion of the imaging device extends within the aperture, and further wherein the gap is an annular gap.

A16. The probe system of paragraph A15, wherein the at least a portion of the imaging device includes a lens of the imaging device.

A17. The probe system of any of paragraphs A1-A16, wherein the system further includes a purge gas supply system configured to selectively supply a purge gas stream to the enclosed volume.

A18. The probe system of paragraph A17, wherein the purge gas supply system is configured to supply the purge gas stream to the enclosed volume when the temperature of the chuck is less than a/the threshold temperature and to cease supply of the purge gas stream to the enclosed volume when the temperature of the chuck is greater than the threshold temperature.

A19. The probe system of any of paragraphs A17-A18 when dependent from any of paragraphs A2-A16, wherein the flow-regulating structure is configured to maintain a/the resistance to fluid flow through the fluid conduit at a/the maximum resistance when the purge gas stream is supplied to the enclosed volume and to selectively regulate the resistance to fluid flow through the fluid conduit when the purge gas stream is not supplied to the enclosed volume.

A20. The probe system of any of paragraphs A1-A19, wherein the chuck thermal module is configured to selectively regulate the temperature of the chuck between a minimum chuck temperature and a maximum chuck temperature, optionally wherein:
  (i) the minimum chuck temperature is at most 0° C., at most −20° C., at most −40° C., at most −60° C., at most −80° C., at most −100° C., or at most −150° C.; and
  (ii) the maximum chuck temperature is at least 200° C., at least 250° C., at least 300° C., at least 350° C., at least 400° C., at least 450° C., or at least 500° C.

A21. The probe system of any of paragraphs A1-A20, wherein the imaging device includes at least one of:
  (i) a microscope;
  (ii) a camera; and
  (iii) a charge coupled device.

A22. The probe system of any of paragraphs A1-A21, wherein the imaging device extends at least partially within the enclosed volume.

A23. The probe system of any of paragraphs A1-A22, wherein the optical pathway extends to, or through, the aperture.

A24. The probe system of any of paragraphs A1-A23, wherein the aperture at least partially defines the fluid conduit.

A25. The probe system of any of paragraphs A1-A24, wherein the fluid conduit extends through the aperture.

A26. The probe system of any of paragraphs A1-A25, wherein the substrate includes a device under test (DUT), and further wherein the probe system is configured to test the operation of the DUT.

A27. The probe system of paragraph A26, wherein the probe system further includes a probe assembly configured to at least one of:
  (i) provide a test signal to the DUT; and
  (ii) receive a resultant signal from the DUT.

A28. The probe system of paragraph A27, wherein the probe system further includes a signal generation and analysis assembly configured to at last one of:
  (i) generate the test signal and provide the test signal to the probe assembly; and
  (ii) receive the resultant signal from the probe assembly and analyze the resultant signal.

A29. The probe system of any of paragraphs A27-A28, wherein the probe assembly includes a plurality of probes configured to electrically contact a plurality of corresponding probed locations on the DUT.

A30. The probe system of any of paragraphs A27-A29, wherein the probe assembly is configured for at least one of:
  (i) electrical communication with the DUT;
  (ii) electromagnetic communication with the DUT;
  (iii) wireless communication with the DUT; and
  (iv) optical communication with the DUT.

A31. The probe system of any of paragraphs A1-A30, wherein the system further includes a chuck translation structure configured to operatively translate the chuck relative to a/the probe assembly.

B1. A method of utilizing a probe system to collect an optical image of a device under test (DUT), the method comprising:
  placing a substrate, which includes the DUT, on a support surface of a chuck, wherein the support surface is contained within an enclosed volume of an enclosure;
  selectively regulating a temperature of the chuck with a chuck thermal module;
  selectively regulating a fluid flow rate through a fluid conduit based, at least in part, on the temperature of the chuck, wherein the fluid conduit is at least partially defined by a gap that extends between the enclosure and an imaging device; and collecting the optical image of the DUT with the imaging device via an optical pathway that extends through an aperture that is defined by the enclosure.

B2. The method of paragraph B1, wherein the selectively regulating the fluid flow rate includes at least one of:
(i) selectively increasing the fluid flow rate responsive to an increase in the temperature of the chuck; and
(ii) selectively decreasing the fluid flow rate responsive to a decrease in the temperature of the chuck.

B3. The method of any of paragraphs B1-B2, wherein the selectively regulating the fluid flow rate includes selectively regulating a resistance to fluid flow through the fluid conduit, optionally by at least one of:
(i) selectively decreasing the resistance to fluid flow responsive to an increase in the temperature of the chuck; and
(ii) selectively increasing the resistance to fluid flow responsive to a decrease in the temperature of the chuck.

B4. The method of paragraph B3, wherein the selectively regulating the fluid flow rate includes selectively regulating the resistance to fluid flow between a minimum resistance and a maximum resistance.

B5. The method of paragraph B4, wherein the method further includes selectively purging the enclosed volume of the enclosure with a purge gas stream when the temperature of the chuck is less than a threshold temperature and selectively ceasing the purging when the temperature of the chuck is greater than the threshold temperature.

B6. The method of paragraph B5, wherein the method further includes maintaining the resistance to fluid flow at the maximum resistance during the selectively purging and selectively varying the resistance to fluid flow between the minimum resistance and the maximum resistance during the selectively ceasing the purging.

B7. The method of any of paragraphs B5-B6, wherein the threshold temperature is at least one of:
(i) at least −100° C., at least −80° C., at least −60° C., at least −40° C., at least −30° C., at least −20° C., at least −10° C., at least 0° C., at least 10° C., or at least 20° C.; and
(ii) at most 400° C., at most 300° C., at most 200° C., at most 100° C., at most 80° C., at most 60° C., at most 40° C., at most 20° C., at most 0° C., or at most −20° C.

B8. The method of any of paragraphs B1-B7, wherein the method includes selectively varying the temperature of the chuck between a minimum chuck temperature and a maximum chuck temperature, optionally wherein:
(i) the minimum chuck temperature is at most 0° C., at most −20° C., at most −40° C., at most −60° C., at most −80° C., at most −100° C., or at most −150° C.; and
(ii) the maximum chuck temperature is at least 200° C., at least 250° C., at least 300° C., at least 350° C., at least 400° C., at least 450° C., or at least 500° C.

B9. The method of any of paragraphs B1-B8, wherein the method further includes testing the operation of the DUT.

B10. The method of any of paragraphs B1-B9, wherein the method further includes electrically contacting the DUT with a probe of a probe assembly, wherein the collecting the optical image includes collecting the optical image during, or to facilitate, the electrically contacting.

B11. The method of any of paragraphs B1-B10, wherein the probe system includes, and optionally is, the probe system of any of paragraphs A1-A31.

INDUSTRIAL APPLICABILITY

The probe systems and methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system, comprising:
a chuck defining a support surface configured to support a substrate;
a chuck thermal module configured to regulate a temperature of the chuck;
an enclosure defining:
(i) an enclosed volume that contains the support surface of the chuck; and
(ii) an aperture defined within a portion of the enclosure that faces toward the support surface of the chuck;
an imaging device at least partially external to the enclosed volume and configured to generate an optical image of at least a portion of the substrate via an optical pathway that extends from the support surface and toward the aperture, wherein the enclosure and the imaging device define a gap therebetween, wherein the gap at least partially defines a fluid conduit that permits fluid flow, via the aperture, between the enclosed volume and an external region that is external the enclosed volume; and
a flow-regulating structure configured to regulate fluid flow through the fluid conduit.

2. The probe system of claim 1, wherein the flow-regulating structure is configured to at least one of:
(i) selectively obstruct fluid flow through the fluid conduit; and
(ii) selectively regulate a resistance to fluid flow through the fluid conduit.

3. The probe system of claim 1, wherein the flow-regulating structure is configured to automatically regulate the resistance to fluid flow based, at least in part, on the temperature of the chuck.

4. The probe system of claim 1, wherein the flow-regulating structure is configured to at least one of:
(i) selectively decrease a resistance to fluid flow through the fluid conduit responsive to an increase in the temperature of the chuck; and (ii) selectively increase the resistance to fluid flow through the fluid conduit responsive to a decrease in the temperature of the chuck.

5. The probe system of claim 1, wherein the flow-regulating structure is configured to selectively regulate a resistance to fluid flow through the fluid conduit between a minimum resistance and a maximum resistance, and further wherein the flow-regulating device is configured to:
(i) maintain the resistance to fluid flow through the fluid conduit at the maximum resistance when the temperature of the chuck is less than a threshold temperature of the chuck; and
(ii) selectively regulate the resistance to fluid flow through the fluid conduit between the minimum resistance and the maximum resistance when the temperature of the chuck is greater than the threshold temperature of the chuck.

6. The probe system of claim 1, wherein the flow-regulating structure is a passive flow-regulating structure configured to passively regulate the fluid flow through the fluid conduit based, at least in part, on a temperature of the flow-regulating structure.

7. The probe system of claim 1, wherein the flow-regulating structure is an actively controlled flow-regulating structure configured to regulate the fluid flow through the fluid conduit responsive to receipt of a control signal.

8. The probe system of claim 1, wherein the system further includes a purge gas supply system configured to selectively supply a purge gas stream to the enclosed volume.

9. The probe system of claim 8, wherein the purge gas supply system is configured to supply the purge gas stream to the enclosed volume when the temperature of the chuck is less than a threshold temperature and to cease supply of the purge gas stream to the enclosed volume when the temperature of the chuck is greater than the threshold temperature.

10. The probe system of claim 8, wherein the flow-regulating structure is configured to maintain a resistance to fluid flow through the fluid conduit at a maximum resistance when the purge gas stream is supplied to the enclosed volume and to selectively regulate the resistance to fluid flow through the fluid conduit when the purge gas stream is not supplied to the enclosed volume.

11. A method of utilizing a probe system to collect an optical image of a device under test (DUT), the method comprising:
placing a substrate, which includes the DUT, on a support surface of a chuck, wherein the support surface is contained within an enclosed volume of an enclosure;
selectively regulating a temperature of the chuck with a chuck thermal module;
selectively regulating a fluid flow rate through a fluid conduit based, at least in part, on the temperature of the chuck, wherein the fluid conduit is at least partially defined by a gap that extends between the enclosure and an imaging device; and
collecting the optical image of the DUT with the imaging device via an optical pathway that extends through an aperture that is defined by the enclosure.

12. The method claim 11, wherein the selectively regulating the fluid flow rate includes at least one of:
(i) selectively increasing the fluid flow rate responsive to an increase in the temperature of the chuck; and
(ii) selectively decreasing the fluid flow rate responsive to a decrease in the temperature of the chuck.

13. The method of claim 11, wherein the selectively regulating the fluid flow rate includes selectively regulating a resistance to fluid flow through the fluid conduit, by at least one of:
(i) selectively decreasing the resistance to fluid flow responsive to an increase in the temperature of the chuck; and
(ii) selectively increasing the resistance to fluid flow responsive to a decrease in the temperature of the chuck.

14. The method of claim 13, wherein the selectively regulating the fluid flow rate includes selectively regulating the resistance to fluid flow between a minimum resistance and a maximum resistance.

15. The method of claim 14, wherein the method further includes selectively purging the enclosed volume of the enclosure with a purge gas stream when the temperature of the chuck is less than a threshold temperature and selectively ceasing the purging when the temperature of the chuck is greater than the threshold temperature.

16. The method of claim 15, wherein the method further includes maintaining the resistance to fluid flow at the maximum resistance during the selectively purging and selectively varying the resistance to fluid flow between the minimum resistance and the maximum resistance during the selectively ceasing the purging.

17. The method of claim 15, wherein the threshold temperature is at least at least −100° C. and at most 400° C.

18. The method of claim 11, wherein the method includes selectively varying the temperature of the chuck between a minimum chuck temperature and a maximum chuck temperature, wherein the minimum chuck temperature is at most 0° C. and the maximum chuck temperature is at least 200° C.

19. The method of claim 11, wherein the method further includes testing the operation of the DUT.

20. The method of claim 11, wherein the method further includes electrically contacting the DUT with a probe of a probe assembly, wherein the collecting the optical image includes collecting the optical image during, or to facilitate, the electrically contacting.

* * * * *

UNITED STATES PATENT AND TRADEMARK OFFICE
CERTIFICATE OF CORRECTION

PATENT NO.         : 10,698,025 B2                         Page 1 of 1
APPLICATION NO.    : 16/445719
DATED              : June 30, 2020
INVENTOR(S)        : Michael Teich and Axel Becker It is certified that error appears in the above-identified patent and that said Letters Patent is hereby corrected as shown below:

In the Claims

Claim 17, Column 18, Line 40, in the phrase "temperature is at least at least …" please delete the second "at least".

Signed and Sealed this
Twenty-second Day of September, 2020

Andrei Iancu
*Director of the United States Patent and Trademark Office*